United States Patent [19]

Hendrickson et al.

[11] 4,156,199
[45] May 22, 1979

[54] APPARATUS FOR SHIFTING A TUNING WINDOW

[75] Inventors: Melvin C. Hendrickson, Elmhurst; Richard G. Merrell, Darien, both of Ill.

[73] Assignee: Zenith Radio Corporation, Glenview, Ill.

[21] Appl. No.: 796,273

[22] Filed: May 12, 1977

[51] Int. Cl.² .......................... H04B 1/26; H04N 5/44
[52] U.S. Cl. ..................................... 325/464; 325/468; 358/191
[58] Field of Search ............... 325/453, 464, 468, 419, 325/420, 421, 422; 358/191, 195

[56] References Cited

U.S. PATENT DOCUMENTS

| 3,980,951 | 9/1976 | Breeze et al. | 325/464 |
| 4,031,549 | 6/1977 | Rast et al. | 325/419 |
| 4,038,689 | 7/1977 | Rzeszewski et al. | 325/464 |

*Primary Examiner*—Robert L. Griffin
*Assistant Examiner*—Marc E. Bookbinder
*Attorney, Agent, or Firm*—Nicholas A. Camasto; Jack Kail

[57] ABSTRACT

A television window tuning system has duty cycle adjustment means for selectively varying the duty cycle of the tuner associated local oscillator signal. Increasing the duty cycle of the local oscillator signal effectively shifts the tuning window in frequency space in one direction while decreasing the duty cycle shifts the window in the opposite direction. In one embodiment of the invention, the duty cycle adjustment means is set for producing a 0% duty cycle oscillator signal for deriving a tuning window particularly adaptable for use with conventional AFC systems.

8 Claims, 7 Drawing Figures

PRIOR ART

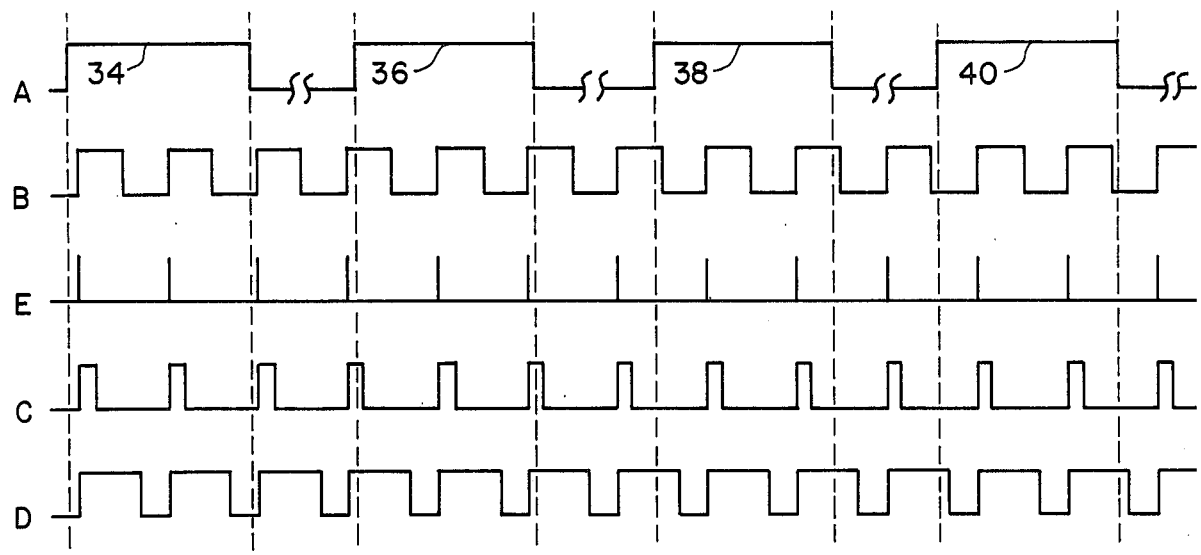
FIG. 4
| COUNT ENABLE PULSE | B | C | D | E |
|---|---|---|---|---|
| 34 | 2 | 2 | 2 | 2 |
| 36 | 3 | 3 | 3 | 2 |
| 38 | 3 | 2 | 3 | 2 |
| 40 | 2 | 2 | 3 | 2 |
| PROB. OF n | 0.5 | 0.75 | 0.25 | 1.0 |
FIG. 5
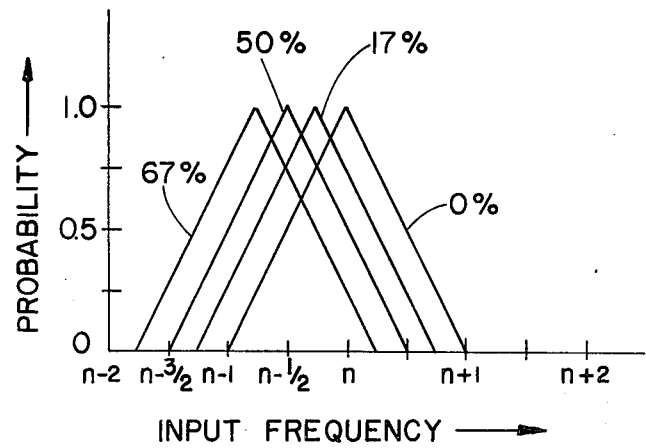
FIG. 6

APPARATUS FOR SHIFTING A TUNING WINDOW

CROSS REFERENCE TO RELATED PATENT APPLICATION

This application claims material originally disclosed but not claimed in related copending application Ser. No. 718,746, filed Aug. 30, 1976 entitled WIDE WINDOW TUNING SYSTEM in the name of Akio Tanaka and assigned to Zenith Radio Corporation, assignee of the present invention.

BACKGROUND OF THE INVENTION

The present invention relates generally to all-electronic television receiver tuning systems and, more particularly, to such systems wherein tuning is at least in part accomplished by establishing a "tuning window" about the local oscillator frequency (LOF) corresponding to the picture carrier of a selected television channel.

U.S. Pat. No. 3,961,266 to Tanaka, assigned to the assignee of the present invention, discloses a television receiver tuning system including means for establishing a "tuning window" (i.e. a restricted region of acceptable frequencies) about the LOF corresponding to the assigned picture carrier frequency of a selected FCC designated television channel. Within the tuning frequency window, a conventional automatic frequency control (AFC) system operates to lock the LOF of the tuner in proper relationship to the received picture carrier frequency insuring conversion thereof to the proper IF frequency. Should the LOF drift or otherwise depart from the established boundaries of the tuning window, the tuner initiates a tuning sequence adapted to drive the LOF back within the confines of the window. Thereafter, system tuning is again released to the AFC system. Advantages attributable to a system wherein tuning is initially established relative to a range of frequencies include the capability of properly processing signals subject to carrier frequency errors. Carrier frequency errors of the sort contemplated may result from, for example, broadcast frequency discrepancies as well as discrepancies introduced in signals rebroadcast for cable television systems. The latter, in particular, may suffer from extreme carrier frequency errors deviating by as much as 2MHz from the appropriate FCC allocated carrier frequency. Since a particular picture carrier may be sufficiently offset from its assigned frequency so as to fall outside the boundaries of the tuning window, it would be desirable to provide means conveniently operable for displacing or shifting an established tuning window in frequency space to further increase the tuning system's ability to accommodate such off-frequency picture carriers.

Moreover, in its preferred embodiment, the tuning system described in the foregoing Tanaka patent teaches the use of a ±½MHz window centered about the LOF corresponding to the assigned picture carrier of a selected television channel. This necessitated a disproportionate AFC range of ±1MHz, since there was no way to know in which portion of the frequency window an "off-frequency" carrier might be nor where actual system tuning would be (within the window) when released to AFC.

In order to accommodate picture carriers offset from their FCC-allocated frequency by as much as 2MHz, the previously referenced related copending application describes a tuning system wherein means are provided for initially driving the local oscillator to the frequency corresponding to the assigned picture carrier of a selected television channel prior to establishing the tuning window thereabout. The system, therefore, is always initially tuned to the center of its tuning window and the AFC circuit needs a pull-in range of ± one-half the window width. Since conventional AFC systems are generally limited to capture ranges of ±2MHz, it would therefore be advantageous to provide means in association with the tuning system for establishing a tuning window consisting of a 4MHz range of frequencies centered about the LOF corresponding to an assigned picture carrier.

SUMMARY OF THE INVENTION

It is therefore an object of the present invention to provide an improved television window tuning system.

Another object of the invention is to provide a television window tuning system having an improved capability for accommodating picture carriers offset from their FCC allocated frequencies.

In accordance with the foregoing and other useful objects, a television window tuning system according to the present invention comprises a varactor tuner having a voltage controlled local oscillator developing a local oscillator signal in response to the tuning voltage supplied by a controllable voltage generating device. Control means operate the voltage generator in response to the local oscillator signal for tuning the oscillator to within a restricted frequency range (i.e. a tuning window) about the frequency corresponding to the assigned picture carrier of a selected television channel. In order to accommodate off-frequency picture carriers having correspondingly displaced local oscillator frequencies, means are provided for shifting the tuning window within the selected television channel enabling proper tuning of the local oscillator to an off-frequency picture carrier.

BRIEF DESCRIPTION OF THE DRAWINGS

FIG. 4 shows a series of exemplary waveforms useful for facilitating an explanation of the present invention.

FIG. 5 shows a table associated with the waveforms of FIG. 4.

FIG. 6 shows a family of probability curves for an asynchronous counting system.

DESCRIPTION OF THE PREFERRED EMBODIMENT

Figure 1:
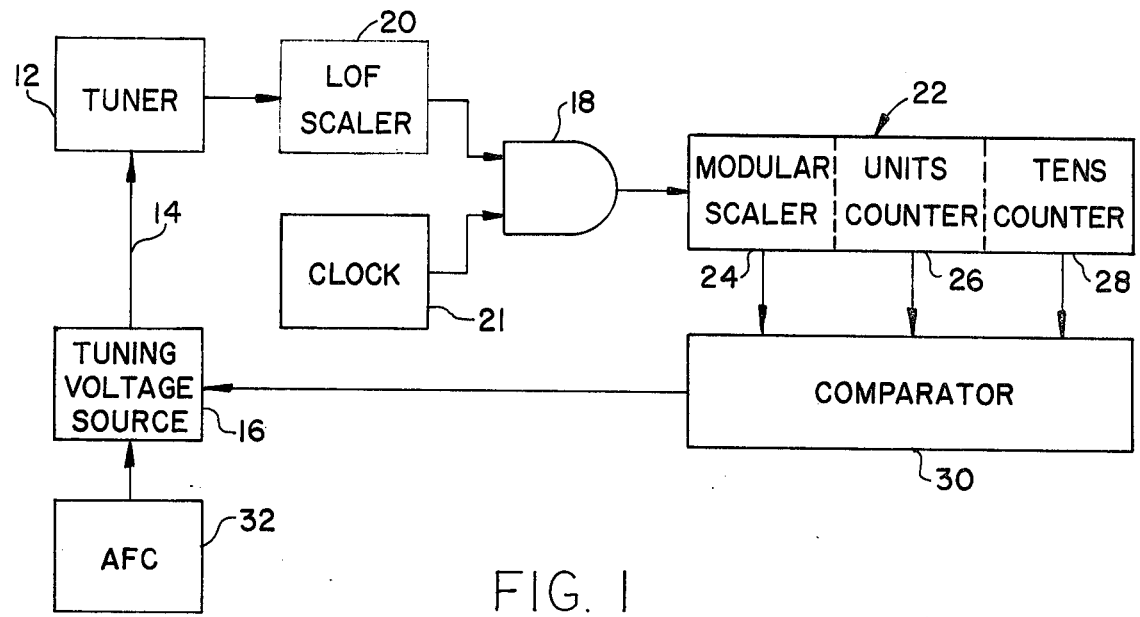
FIG. 1 is a block diagram illustrating pertinent portions of a prior art television window tuning system.
Figure 2:
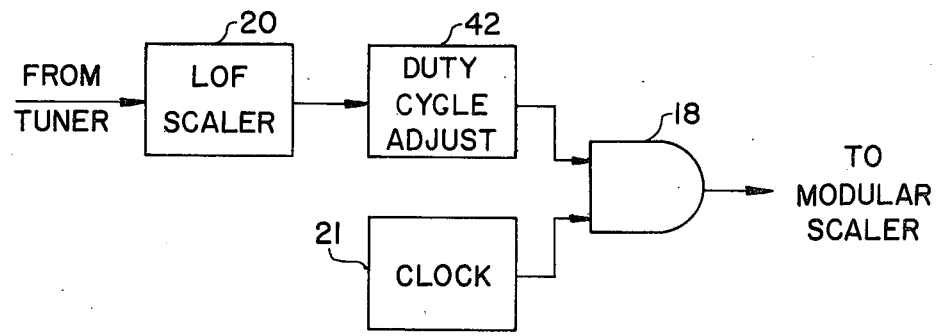
FIG. 2 depicts, in block diagram form, a modification according to the present invention of the tuning system shown in FIG. 1.

Referring now to the drawings, FIG. 1 shows the pertinent portions of a prior art window tuning system according to the teachings of the previously mentioned Tanaka patent. The illustrated system comprises a conventional varactor tuner 12 for converting broadcast television signals to an IF frequency for subsequent processing by the television receiver. To implement the conversion operation, tuner 12 includes a voltage controlled local oscillator developing a local oscillator signal in response to a tuning voltage applied over a line 14 from a tuning voltage source 16. The local oscillator frequency (LOF) is controlled so that upon heterodyning the local oscillator signal with the broadcast television signal an IF signal having a predetermined frequency results.

The local oscillator signal is also coupled to one input of an AND gate 18 through a LOF scaler 20, the other input to AND gate 18 being supplied from a clock 21. The output of AND gate 18 is coupled to a chain of counters 22 consisting of a modular scaler 24, a units counter 26 and a tens counter 28. Counter 22, after being appropriately preset according to the selected television channel, counts the LOF related pulses appearing at the output of AND gate 18 during fixed time intervals defined by a count enable signal generated by clock 21. In counter 22, modular scaler 24 is driven directly by the LOF related pulses developed at the output of AND gate 18, units counter 26 is driven by modular scaler 24 and tens counter 28 is driven by units counter 26. Due to the configuration of counter 22 and the timing of its operation, the count developed thereby during each successive count enable interval corresponds to the tuning status of tuner 12 wherein the count registered by units counter 26 and tens counter 28 represents the television channel tuned to while the residue registered in modular scaler 24 represents a fraction of the intrachannel spacing of the tuner frequency. By using a modulus of six, each residue unit of modular scaler 24 conveniently corresponds to 1/6 of the 6MHz television channel or a frequency of 1MHz.

A comparator 30 is responsive to the states of counters 24, 26, and 28 for controlling tuning voltage source 16 which, in turn, supplies the voltage controlled local oscillator of tuner 12 for determining the LOF. In operation, comparator 30 drives varactor tuner 12 in the appropriate direction for developing a LOF causing units counter 26 and tens counter 28 to exhibit states corresponding to the selected channel. As will be discussed in further detail below, the tuning system of FIG. 1 is characterized by an inherent ambiguity wherein, for the 50% duty cycle LOF related signal developed at the output of LOF scaler 20, there exists a finite probability that the residue developed in modular scaler 24 consists of one count more than would be expected for the time sampled LOF related signal. Using this inherent ambiguity, comparator 30 drives tuner 12 until modular scaler 24 indicates the expected count n or the count n+1. Setting comparator 30 for accepting the two adjacent counts n, n+1 results in the creation of a ±½MHz tuning window centered about the assigned LOF. Within this tuning window, tuning voltage source 16 operates the local oscillator of tuner 12 in response to inputs from an AFC circuit 32 for locking the LOF to the received picture carrier.

While a detailed explanation of the mechanism causing the inherent ambiguity characterizing the count developed by modular scaler 24 is provided in the Tanaka patent, a brief explanation is also included herein for the purpose of completeness and to facilitate an understanding of the present invention. In this regard, the tuning system shown in FIG. 1 implements an asynchronous gated counting arrangement for deriving the tuning window about the LOF corresponding to a selected picture carrier. In an asynchronous gated counting system, there is no attempt made to control the phase relationship between the clock signal, i.e. the count enable signal from clock 21, and the signal to be counted, the LOF related signal from LOF scaler 20. As a result, assuming the use of 50% duty cycle signals, there is a finite probability of the counter indicating two results for successive measurements of a fixed frequency signal input. This phenomenon is most clearly illustrated with reference to the waveforms of FIG. 4 in conjunction with the table of FIG. 5. In FIG. 4, waveform A represents the output of clock 21 and comprises a fixed frequency count enable signal applied to AND gate 18. Waveform B represents the output of LOF scaler 20 applied to the other input of AND gate 18 and comprises a 50% duty cycle square wave having a fixed frequency n where n is an integer. For purposes of illustration, it is assumed that n equals a value of 2. Consequently, the output of AND gate 18 comprises a train of pulses defined by the intervals of coincidence between count enable signal, waveform A, and the scaled down LOF signal, waveform B. Assuming that modular scaler 24 is configured for counting the leading edges of the output of AND gate 18, it will be observed that during the interval defined by pulse 34 of the count enable signal a count of 2 will be achieved. However, due to the random phasing between the count enable signal and the scaled down LOF signal, during the interval defined by pulse 36 modular scaler 24 will register a count of 3. Similarly, during the interval defined by count enable pulse 38 counter 22 will also register a count of 3. Finally, during pulse 40 a count of 2 will result. As conceptually illustrated in the foregoing example, it can be shown that, for a 50% duty cycle LOF signal, there is an equal probability of the occurrences of counter readings of n and n+1. In other words, the probability of the reading being n is 0.5 and the probability of the reading being n+1 is 0.5. Thus, in the foregoing example, two readings of n were obtained and two readings of n+1 were obtained.

The probability of occurrence of specific readings using an asynchronously gated counting system is illustrated in the probability curves of FIG. 6. It will be noted that the probability curve identified as 50% (corresponding to a 50% duty cycle LOF signal) is triangularly shaped and centered about n−½. According to the curve, if the input LOF frequency corresponds to n−½ there is a 1.0 probability of modular scaler 24 reading n. On the other hand, if the input LOF frequency corresponds to n or n−1 there is only a 0.5 probability of reading n. Moreover, if the input LOF frequency is n−3/2 or less or if the frequency is n+½ or more, there is a 0.0 probability of modular scaler 24 reading n.

Figure 7:
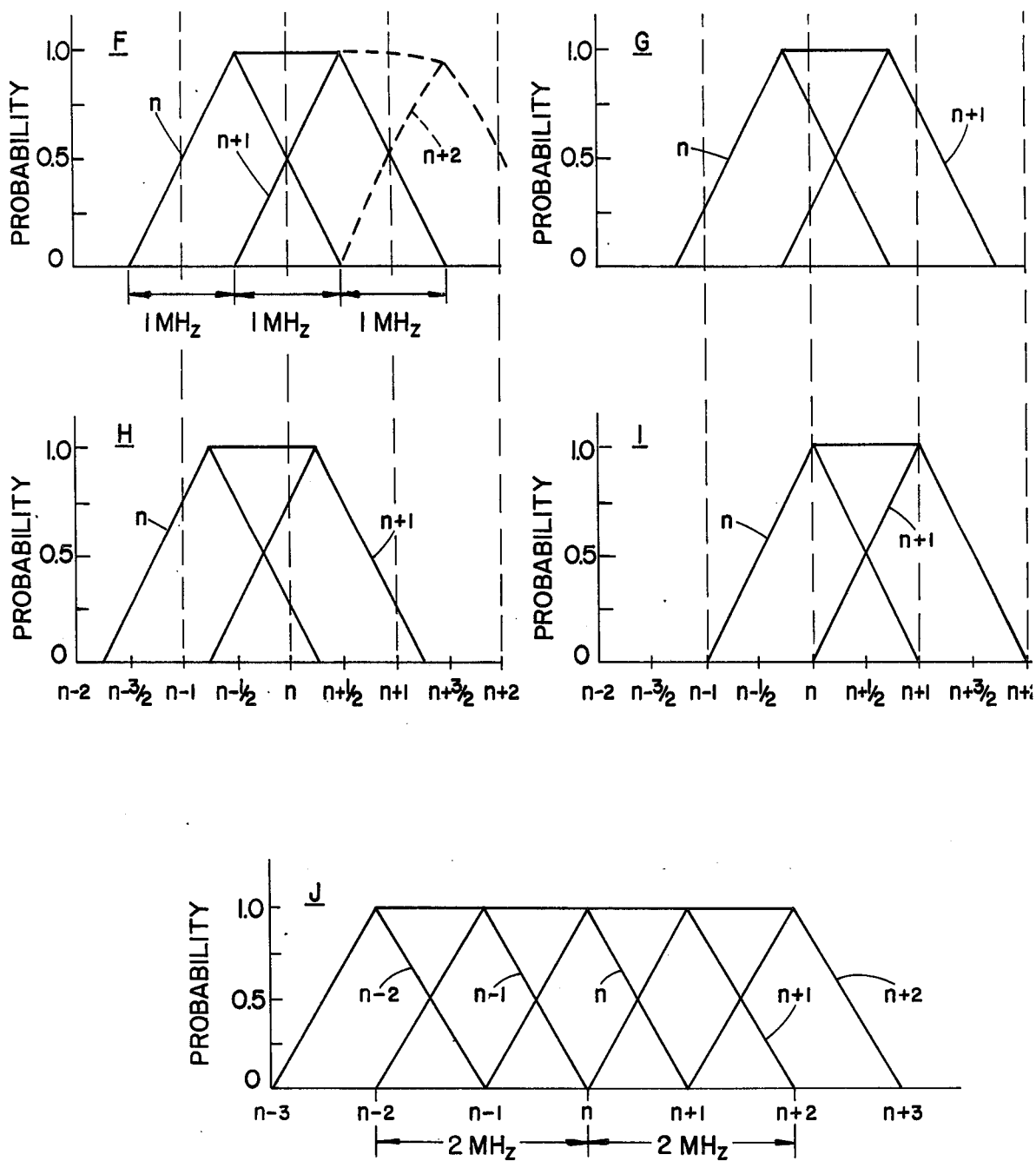
FIG. 7 shows a series of tuning windows formed by combining a number of the probability curves of FIG. 6.

Graph F of FIG. 7 illustrates the probability of reading either n or n+1 for a 50% duty cycle LOF signal and is derived by superimposing two triangular probability curve for n and n+1. Graph F, which is in the form of a trapezoid, indicates that frequencies falling in the range between n−½ and n+½ have a 1.0 probability of being read as either n or n+1. For frequencies less than n−½ and greater than n+½ there is a diminishing probability of reading one of the acceptable counts, n or n+1. For frequencies less than n−3/2 and greater than n+3/2 there is a 0.0 probability of modular scaler indicating either acceptable count. It is thus seen that by configuring comparator 30 for accepting two adjacent residues n, n+1 of modular scaler 24, a 1MHz tuning window centered about an assigned LOF (i.e. n) is created. Therefore, the tuning system will properly tune to any picture carrier having a corresponding LOF falling within this tuning window.

It will be recognized that the prior art window tuning system described above will not properly tune to off-frequency picture carriers having LOF's falling beyond the boundary of the defined tuning window. For example, referring to Graph F of FIG. 7, the tuning system will not properly tune to an off-frequency carrier having a corresponding LOF located at n+¾ (i.e. a picture carrier displaced 0.75MHz from its assigned value) since this LOF value is not included within the ±½MHz tuning window.

According to the present invention means are provided, independent of comparator 30 and not affecting the duration of the count interval, for adjustably displacing or shifting a defined tuning window to accommodate such off-frequency picture carriers. Implementation of the window shifting operation is conveniently accomplished by interposing a duty cycle adjustment means 42 between LOF scaler 20 and AND gate 18. Duty cycle adjustment means 42 may comprise any of a number of well known and conventional devices having the ability to adjustably alter the duty cycle of an input signal. A monostable multivibrator whose alternate states are controllable by an adjustment potentiometer is one example of such a device. Alternately, duty cycle adjustment can also be accomplished in digital increments by appropriately connecting a gating network to a digital frequency divider such as LOF scaler 20. In any event, as will be explained below, varying the duty cycle of the LOF related signal developed at the output of LOF scaler 20 effectively alters the probabilities associated with the modular scaler residues which, in turn, has the effect of shifting the tuning window to an extent and in a direction related to the change in duty cycle. In this manner, off-frequency picture carriers can be conveniently accommodated without affecting the remainder of the tuning system.

The effect on modular scaler 24 achieved by varying the duty cycle of the scaled down LOF signal developed at the output of LOF scaler 20 is illustrated in FIGS. 4–6. Recalling that waveform B in FIG. 4 represents the 50% duty cycle LOF signal used in the prior art system, it will be observed that waveform C consists of a reduced duty cycle LOF signal obtained by passing the LOF signal through duty cycle adjust means 42. The effect of reducing the duty cycle of the scaled down LOF signal (the duty cycle of waveform C is about 17%) is to increase the probability of modular scaler 24 registering a residue of n in response to a scaled down LOF signal having a fixed frequency n. Thus, in the example illustrated in FIG. 4 (n=2), modular scaler 24 will register a residue of 2 for count enable pulses 34, 38, and 40. A residue of 3 is however, obtained in response to count enable pulse 36. The probability of registering 2 therefore increases from 0.5 in the case of the 50% duty cycle LOF signal (waveform B) to about 0.75 for the case of the 17% duty cycle LOF signal (waveform C). In terms of the probability curves illustrated in FIG. 6, this amounts to shifting the probability triangle about ¼ of a residue unit to the right from its 50% position. The 0.75 probability value associated with waveform C was derived using the limited example illustrated in FIG. 4 showing four possible phase relationships between the 17% duty cycle waveform and the count enable pulse. It can be shown, however, that for a 17% duty cycle signal the actual probability of registering n is 0.83.

Conversely, increasing the duty cycle of the LOF signal results in reducing the probability of modular scaler 24 registering a residue of n in response to a LOF signal having a fixed frequency n. This condition is illustrated by waveform D which has a duty cycle of about 67%. In this case, modular scaler 24 registers residues of 3 in response to count enable pulses 36, 38, and 40 and registers a residue of 2 in response to count enable pulse 34. The resulting probability of registering 2 is thus decreased from 0.5 for the 50% duty cycle signal to about 0.25 for the 67% duty cycle signal. In terms of the probability curves of FIG. 6, this reduction in probability is translated into a displacement of the 50% probability triangle by about ¼ of a residue unit to the left. Furthermore, as in the case of the 17% duty cycle signal, it can be shown that for a 67% duty cycle signal, the actual probability of registering n is 0.33.

The probability of modular scaler 24 registering a residue of 2 can be increased to unity by reducing the duty cycle of the scaled down LOF signal to 0%. This condition, which is illustrated by waveform E, results in modular scaler 24 obtaining a residue of 2 during each of the count enable pulses 34, 36, 38, and 40. Furthermore, the corresponding probability triangle is shifted ½ a residue unit to the right from its 50% position. In view of the foregoing, it will be apparent that the probability triangle illustrated in FIG. 6 can be displaced by a selected amount in either direction by suitably varying the duty cycle of the scaled down LOF signal.

Assuming that comparator 30 has been configured to accept modular scaler residues n, n+1 the effect on the tuning window of varying the duty cycle of the LOF signal is illustrated in FIG. 7. In this regard, graph G represents the condition of superimposing a 17% duty cycle probability triangle with a 17% duty cycle n+1 probability triangle. The result consists of shifting the ±½MHz tuning window illustrated in graph F (50% duty cycle signals) about ¼ of a residue unit to the right. Similarly, as illustrated by graph H, superimposing 67% duty cycle n and n+1 probability triangles displaces the ±½MHz tuning window about ¼ of a residue unit to the left from its position in graph F. Finally, graph I illustrates the condition of adjusting the duty cycle to 0%. It will be noted that the tuning window has been shifted ½ a residue unit to the right from its position from graph F.

Through the use of duty cycle adjust means 42 it will, therefore, be apparent that off-frequency picture carriers can be conveniently accommodated by suitably shifting the tuning window by an appropriate amount in a given direction. For example, assume that an originally configured ±½MHz window is centered about a frequency of 2MHz so that its lower boundary is 1.5MHz and its upper boundary is 2.5MHz. Now, if the LOF corresponding to a received off-frequency picture carrier actually occurs at 2.2MHz, it would be desirable to center the ±½MHz window about 2.2MHz. Such is conveniently achieved by setting duty cycle adjust means 42 for appropriately reducing the duty cycle of the LOF signal thereby shifting the tuning window to the right until it is centered at 2.2MHz where it will have a lower boundary at 1.7MHz and an upper boundary at 2.7MHz. In a similar fashion, by setting duty cycle adjust means 42 for increasing the duty cycle of the LOF signal, the tuning window is shiftable to the left for accommodating LOF's less than 2.0MHz. Thus, the window can be shifted, for example, such that it is centered at 1.8MHz and have a lower boundary at 1.3MHz and an upper boundary at 2.3MHz.

A particularly advantageous tuning window is constructed by adjusting the duty cycle of the scaled down LOF signal to 0% while programming comparator 30 for accepting modular scaler residues n−2, n−1, n, n+1 and n+2. The resulting tuning window, illustrated in graph J, consists of a ±2MHz band of frequencies centered about n. This window configuration is particularly compatible for operation in conjunction with conventional AFC circuits which typically have capture ranges of ±2MHz. In other words, the width of the tuning window is maximized within the capabilities of the AFC system to accommodate even severely displaced off-frequency picture carriers. The prior art tuning window which, although expandable, could not be easily configured for obtaining a ±2MHz window centered about n. The most nearly optimum windows achievable in the prior art system are a ±1½MHz window centered about n (obtained by adding a 1MHz increment to each side of the original ±½MHz window, i.e. graph F) or a ±2½MHz window (obtained by adding two 1MHz increments to each side of the original ±½MHz window).

Figure 3:
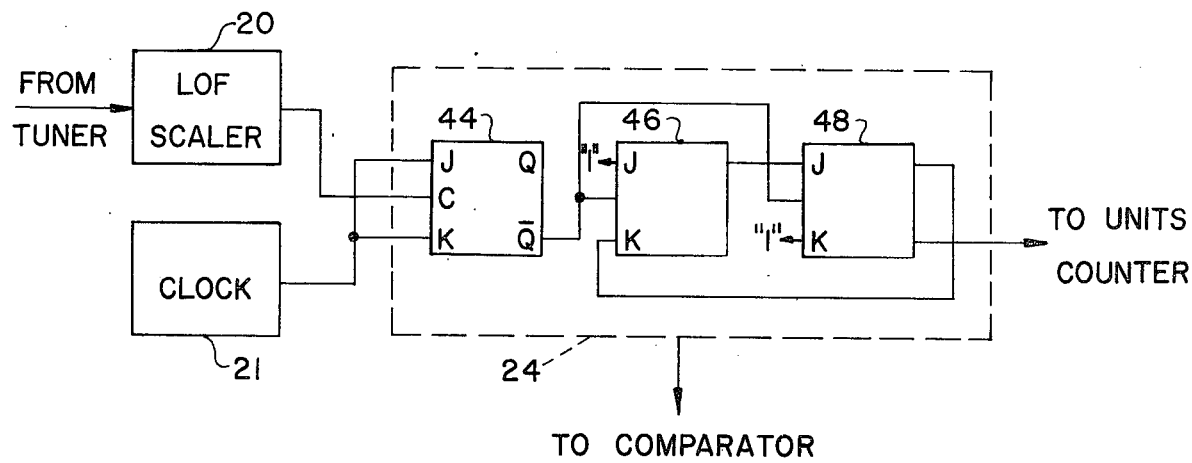
FIG. 3 depicts, in block diagram form, another modification according to the present invention of the tuning system shown in FIG. 1.

While the ±2MHz tuning window illustrated in graph J is obtainable by setting duty cycle adjust means 42 for achieving a LOF related signal having a 0% duty cycle, an alternate arrangement for producing the same result is illustrated in FIG. 3. In the illustrated arrangement, modular scaler 24 comprises three JK flip-flops 44, 46, and 48 suitably interconnected in a modulus six counting configuration. Duty cycle adjust means 42 is eliminated from the circuit and, in place thereof, the output of LOF scaler 20 is connected directly to the clock terminal of input JK flip-flop 44 while the count enable signal from clock 21 is coupled to the J and K terminals of the flip-flop. Characteristically, input JK flip-flop 44 will change state in response to the leading edges of a pulsating signal applied to its clock terminal whenever its J and K terminals are both logically "1." Therefore, for the duration of a count enable signal, flip-flop 44 will change state in response to each leading edge of the scaled down LOF signal. Referring to waveform B of FIG. 4, it will be noted that, as a result, modular scaler 24 will register a residue of 2 in response to each count enable pulse 34, 36, 38, and 40; a result equivalent to adjusting the LOF for a 0% duty cycle. Thus, by accepting the modular residues n−2, n−1, n, n+1, n+2 and using the circuit arrangement illustrated in FIG. 3, a tuning window as illustrated in FIG. 7, graph J is produced without changing the duty cycle of the LOF signal.

While particular embodiments of the present invention have been shown and described, it will be apparent that changes and modifications may be made therein without departing from the invention in its broader aspects. The aim of the appended claims, therefore, is to cover all such changes and modifications as fall within the true spirit and scope of the invention.

What is claimed is:

1. In a television receiver tuning system of the type having a voltage controlled local oscillator for developing a local oscillator signal, generating means operable for supplying a tuning voltage to said oscillator and operating means operating said generating means in response to said local oscillator signal for tuning said oscillator to within a restricted frequency range or window about the frequency corresponding to the assigned picture carrier of a selected television channel, the improvement comprising:

means coupled between said voltage controlled local oscillator and said operating means for adjustably shifting said restricted frequency range relative to said frequency without changing the frequency of said local oscillator, thus enabling tuning of said voltage controlled oscillator to picture carriers associated with said television channel and displaced from said assigned picture carrier.

2. The improvement according to claim 1 wherein said means for shifting comprises means for selectively varying the duty cycle of said local oscillator signal.

3. A tuning system according to claim 2 wherein said means for varying the duty cycle is operated for causing said oscillator signal to exhibit a duty cycle of about 0%.

4. In a television receiver tuning system of the type having a voltage controlled local oscillator for developing a local oscillator signal, means for asynchronously gating said oscillator signal for fixed time intervals, means for counting the cycles of said asynchronously gated oscillator signal for defining fractional intrachannel frequency intervals, means for comparing the counts developed by said means for counting with a preselected condition and voltage generating means responsive to said means for comparing for changing the tuning frequency of said oscillator until said preselected condition occurs corresponding to said oscillator tuning being within a restricted frequency range or window about the local oscillator frequency $f_0$ corresponding to the assigned carrier of a selected television channel, the improvement comprising:

means for shifting said restricted frequency range relative to the local oscillator frequency corresponding to said assigned picture carrier without changing said preselected condition and said fixed time interval and without changing said local oscillator frequency.

5. The improvement according to claim 4 wherein said means for shifting comprises means coupled between said oscillator and said means for gating and operable for varying the duty cycle of said local oscillator signal.

6. A tuning system according to claim 5 wherein said means for varying the duty cycle is configured for causing said oscillator signal to exhibit a duty cycle of about 0% and wherein said preselected condition is selected such that said restricted frequency range is defined according to the expression $(f_0-m) \leq f_0 \leq (f_0+n)$, where $f_0$, m and n are integral multiples of said fractional intrachannel frequency intervals.

7. In a television receiver channel tuning system of the type having a voltage controlled local oscillator for developing a local oscillator signal; driving means for changing the frequency of said oscillator; means asynchronously counting said oscillator signal for deriving channel number information; means for producing desired channel number information; and comparison means controlling said driving means, responsive to said means for counting and to said means for producing, and defining in cooperation therewith a restricted range or window of frequencies about a selected oscillator frequency; the improvement wherein said means for counting comprises:

clock means for developing a count enable signal;
a binary counter having an input JK flip-flop and a plurality of outputs, at least some of said outputs being connected to said comparison means;

means coupling said count enable signal to the J and K terminals of said input JK flip-flop; and means coupling said oscillator signal to the clock terminal of said input JK flip-flop.

8. In a television receiver tuning system of the type including a voltage controlled local oscillator for developing a local oscillator signal and means operable for tuning said oscillator to a restricted frequency range or window about the frequency corresponding to the assigned picture carrier associated with a selected television channel, the method of operating said tuning system comprising the steps of:

determining the frequency of the picture carrier being received by said tuning system on said selected television channel; and adjusting said restricted frequency range about the frequency of said local oscillator signal corresponding to said determined frequency by varying the duty cycle of said local oscillator signal.

* * * * *